United States Patent
Sumitomo et al.

(10) Patent No.: US 9,343,617 B2
(45) Date of Patent: May 17, 2016

(54) METHOD OF MANUFACTURING LIGHT EMITTING ELEMENT

(71) Applicant: Nichia Corporation, Anan-shi, Tokushima (JP)

(72) Inventors: Hidetsugu Sumitomo, Anan (JP); Hisashi Kasai, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/737,355

(22) Filed: Jun. 11, 2015

(65) Prior Publication Data

US 2015/0364643 A1 Dec. 17, 2015

(30) Foreign Application Priority Data

Jun. 13, 2014 (JP) ................................. 2014-122211
Mar. 6, 2015 (JP) ................................. 2015-044181

(51) Int. Cl.
- H01L 21/00 (2006.01)
- H01L 33/00 (2010.01)
- H01L 33/36 (2010.01)
- H01L 33/46 (2010.01)

(52) U.S. Cl.
CPC ........ *H01L 33/0079* (2013.01); *H01L 33/0075* (2013.01); *H01L 33/36* (2013.01); *H01L 33/46* (2013.01); *H01L 2933/0016* (2013.01); *H01L 2933/0025* (2013.01); *H01L 2933/0033* (2013.01)

(58) Field of Classification Search
None
See application file for complete search history.

(56) References Cited

U.S. PATENT DOCUMENTS

| | | | | |
|---|---|---|---|---|
| 2008/0258165 A1* | 10/2008 | Zimmerman | ....... | H01L 33/0079 257/98 |
| 2010/0051987 A1 | 3/2010 | Katsuno et al. | | |
| 2010/0078656 A1* | 4/2010 | Seo | ........ | H01L 27/156 257/88 |
| 2011/0266568 A1* | 11/2011 | Aldaz | .......... | H01L 33/145 257/98 |
| 2012/0276668 A1* | 11/2012 | Muramoto | .......... | H01L 33/20 438/28 |
| 2013/0248904 A1* | 9/2013 | Sugizaki | .......... | H01L 33/385 257/98 |
| 2015/0179876 A1* | 6/2015 | Hu | .......... | H01L 33/06 257/13 |
| 2015/0325598 A1* | 11/2015 | Pfeuffer | ........ | H01L 25/167 257/59 |

FOREIGN PATENT DOCUMENTS

| | | |
|---|---|---|
| EP | 1 553 640 A1 | 7/2005 |
| JP | 2007-324576 | 12/2007 |
| JP | 2010-56322 | 3/2010 |
| JP | 2013-258174 | 12/2013 |
| WO | WO 2004/013916 A1 | 2/2004 |

* cited by examiner

*Primary Examiner* — Angel Roman
(74) *Attorney, Agent, or Firm* — Foley & Lardner LLP

(57) ABSTRACT

A method of producing light emitting elements includes providing a wafer that includes a growth substrate and a semiconductor structure formed on the growth substrate, a lower side of the wafer being a growth substrate side, and an upper side of the wafer being a semiconductor structure side as an upper side; forming a separation groove in the wafer from the upper side of the wafer to demarcate portions of the semiconductor structure, the separation groove extending in a depth direction to a location in the wafer; forming a p-electrode and an n-electrode on an upper side of each of the demarcated portions of the semiconductor structure; forming a dielectric multilayer film at an upper side of the wafer, including portions defining the separation groove, by using an atomic layer deposition method; and separating the wafer into a plurality of light emitting elements by removing a portion of the wafer from a lower side of the wafer to at least the location to which the separation groove extends.

19 Claims, 5 Drawing Sheets

METHOD OF MANUFACTURING LIGHT EMITTING ELEMENT

CROSS-REFERENCE TO RELATED APPLICATION

The present application claims priority to Japanese Patent Application No. 2014-122211, filed on Jun. 13, 2014, and No. 2015-044181, filed on Mar. 6, 2015, which are incorporated by reference in their entirety.

BACKGROUND

1. Technical Field

The present disclosure relates to a method of producing a light emitting element applicable for displays etc.

2. Background Art

A semiconductor light emitting element described in JP 2010-56322 (which hereinafter may be referred to as a "conventional light emitting element") is provided with a dielectric multilayer film disposed on a portion of its upper surface and side surfaces (for example see FIG. 28).

However, in the conventional light emitting elements, the thickness of the dielectric multilayer film tends to be thinner on the side surfaces than on the upper surface. Further, there may be a region free of the dielectric multilayer film on the side surfaces. This configuration allows for further improvement in the reflective efficiency of the dielectric multilayer film in conventional light emitting elements.

SUMMARY

Certain embodiments of the present invention have been devised in light of the disadvantageous features described above, and an object thereof is to provide a method of producing light emitting elements of high optical output power with good mass productivity.

A method of producing light emitting elements according to an embodiment of the present invention includes providing a wafer that includes a growth substrate and a semiconductor structure formed on the growth substrate, a lower side of the wafer being a growth substrate side, and an upper side of the wafer being a semiconductor structure side as an upper side; forming a separation groove in the wafer from the upper side of the wafer to demarcate portions of the semiconductor structure, the separation groove extending in a depth direction to a location in the wafer; forming a p-electrode and an n-electrode on an upper side of each of the demarcated portions of the semiconductor structure; forming a dielectric multilayer film at an upper side of the wafer, including portions defining the separation groove, by using an atomic layer deposition method; and separating the wafer into a plurality of light emitting elements by removing a portion of the wafer from a lower side of the wafer to at least the location to which the separation groove extends.

With the configuration described above, light emitting elements that have high optical output power can be produced with good mass productivity.

DETAILED DESCRIPTION OF THE EMBODIMENTS

Figure 1:
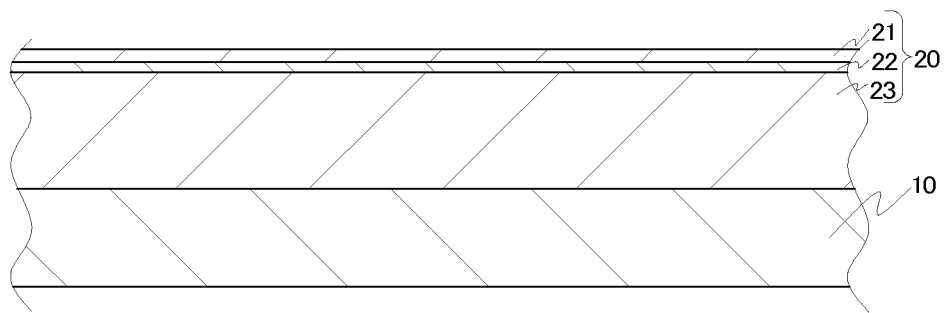
FIG. 1 is a schematic cross-sectional view illustrating a step of a method of producing a light emitting semiconductor element 1000 according to an embodiment.

Embodiments of the present invention will be described below with reference to the accompanying drawings. The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation. Further, in the description below, the same designations or the same reference numerals denote the same or like members and duplicative descriptions will be appropriately omitted. At least one of each of the components is needed to constitute a light emitting element 1000, and a plurality of a single member may also be employed.

FIG. 1 to FIG. 12 are schematic cross-sectional views illustrating a method of producing a light emitting semiconductor element 1000 according to an embodiment. FIG. 13 is an enlarged view of a part enclosed by a broken line in FIG. 12.

A method of producing light emitting elements 1000 according to an embodiment includes: providing a wafer that includes a growth substrate 10 and a semiconductor structure 20 formed on the growth substrate 10, a lower side of the wafer being a growth substrate 10 side, and an upper side of the wafer being a semiconductor structure 20 side (FIG. 1); forming a separation groove having a depth in the wafer from the upper side of the wafer to demarcate the semiconductor structure (FIG. 2); forming a p-electrode 41 and an n-electrode 42 on an upper side of each of the demarcated portions of the semiconductor structure 20 (FIG. 3) (hereinafter, "each of the demarcated portions of the semiconductor structure 20" may be referred to simply as "the semiconductor structure 20".); forming a dielectric multilayer film 52 at an upper side of the wafer, including portions defining the separation groove 30, by using an atomic layer deposition method (FIG. 4); and separating the wafer into a plurality of light emitting elements 1000 by removing a portion of the wafer from a lower side of the wafer to the depth of the separation groove 30.

Accordingly, the light emitting elements 1000 of high optical output can be produced with good mass productivity. More details thereof will be described below.

Conventionally, sputtering or vapor deposition is typically employed for forming a dielectric multilayer film. However, in such a method, due to highly rectilinear propagation characteristics of the reactive components (materials for the dielectric multilayer film), the thickness of each layer (hereinafter may be referred to as a "dielectric layer") that constitutes the dielectric multilayer film may differ depending on the surface where the dielectric layer to be disposed. For example, in the case where a dielectric layer is formed by way of sputtering in a direction perpendicular to the upper surface of the demarcated portions of the semiconductor structure 20, the dielectric layer can be formed on the upper surfaces of the demarcated portions of the semiconductor structure 20 with a desired thickness, but on the side surfaces of the demarcated portions of the semiconductor structure 20, the thickness may be smaller than the desired thickness. That is, depending on the surface on which the dielectric layer to be formed, the dielectric layer may not be formed with its predetermined thickness, resulting in insufficient reflectance as a dielectric multilayer film. On the other hand, in the present embodiment, the dielectric layer is formed by using an atomic layer deposition method (ALD method), so that the dielectric layer can be formed with a relatively uniform thickness regardless of the surface on which the dielectric layer is formed. It is considered that the reactive components have lower rectilinear propagation characteristics in an ALD method compared to sputtering or the like, so that the reactive components can be supplied evenly on the entire upper surface of the wafer, including the separation groove 30.

Further, in the present embodiment, after forming the dielectric multilayer film 52 by way of an ALD method on the surface of the wafer inclusive of the separation groove 30, a portion of the wafer is removed from the lower side of the wafer to reach a bottom defining the separation groove 30, to obtain each of the light emitting elements 1000, by removing a portion of the wafer from the bottom side of the wafer to the depth of the separation groove 30. Thus, the dielectric multilayer film 52 can be formed on the whole side surfaces without creating an area on the side surfaces of the light emitting elements 1000 where the dielectric multilayer 52 is not formed.

For these reasons, according to the method of producing light emitting elements 1000 of the present embodiment, the light emitting elements of high optical output power can be produced with good mass productivity.

Each operation will be described below with reference to FIG. 1 to FIG. 12.

Providing Wafer

As shown in FIG. 1, a wafer which includes a semiconductor structure 20 formed on a growth substrate 10 is provided. The growth substrate 10 is to allow epitaxial growth of a nitride semiconductor and the size, the thickness, or the like is not specifically limited. For the growth substrate 10, for example, an insulating substrate such as a C-plane sapphire substrate can be used.

In the present embodiment, the semiconductor structure 20 includes, for example, an n-type semiconductor 23, an active layer 22, and a p-type semiconductor 21 in this order from the growth substrate 10 side. For the semiconductor structure 20, for example, a stacked layer of a plurality of GaN-based semiconductors (GaN, AlGaN, InGaN, and the like) can be used.

Forming Separation Groove 30

Figure 2:
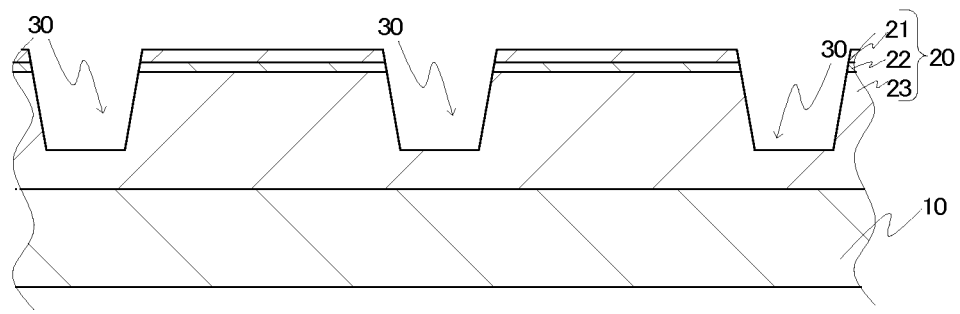
FIG. 2 is a schematic cross-sectional view illustrating a step of a method of producing a light emitting semiconductor element 1000 according to an embodiment.

As shown in FIG. 2, a separation groove 30 of a depth is formed from the upper side of a wafer. The separation groove 30 is formed with a plurality of rows and columns. The separation groove 30 can be formed with a depth reaching the growth substrate 10, but as in the present embodiment, the separation groove 30 is preferably formed with a depth not to reach the growth substrate 10. For example, in the case of forming the separation groove 30 by etching, if the separation groove 30 is to form with a depth that reaches the growth substrate 10, a flat surface may be difficult to obtain due to difference in the etching rate of the semiconductor structure 20 and the growth substrate 10. But with forming the separation groove 30 to a depth within the semiconductor structure 20, a flat surface thereof can be easier to obtain. Also, in the case of removing the growth substrate 10 by laser lift-off, with the separation groove 30 formed to a depth within the semiconductor structure 20, adjacent demarcated portions of the semiconductor structure 20 can be in a state connected with each other at a portion below the bottom edges defining the separation groove 30, in other words, below the depth of the separation groove 30. Accordingly, even in the case where a portion of the wafer is not irradiated with the laser beam at the time of removing the growth substrate 10 by laser lift-off, all the demarcated portions of the semiconductor structures 20 are connected with each other at the lower portions, so that the growth substrate 10 can be removed without removing any semiconductor structures.

The separation groove 30 is formed with a depth (a distance between the upper surface of the demarcated portions of the semiconductor structure 20 and the bottom surface defining the separation groove 30) slightly deeper than a desired length in the longitudinal direction of the light emitting elements 1000. For example, a depth of 3 μm to 7 μm, preferably 5 μm to 6 μm can be employed.

For the method of forming the separation groove 30, etching (dry etching, wet etching, etc.), scribing (cutter scribing, laser scribing, etc.), or dicing, or the like can be used, but in view of manufacturability, or the like, etching is preferably used.

The separation groove 30 can be formed so that the width of the demarcated portions of the semiconductor structure 20 between the separation groove is increased from the upper side toward the lower side. That is, the demarcated portions of the semiconductor structure 10 have a shape gradually expanding from the upper side of the wafer toward the lower side of the wafer. Further, providing the reflecting layers 50 on the demarcated portions of the semiconductor structure 20 which incline as described above, light can be reflected upward efficiently. In FIG. 1 to FIG. 8, a lower side in each drawing (the lower side of the wafer) is the light extracting side, and an upper side in each drawing (the upper side of the wafer) is a mounting side, but in FIG. 9 to FIG. 12, for the sake of convenience, the growth substrate 10 is shown at upper side, so that an upper side in each drawing is the light extracting side and a lower side in each drawing is the mounting side.

The inclination angle of the demarcated portions of the semiconductor structure 20 is preferably 91° to 135°, more preferably 98° to 120°, further preferably 102° to 108°. With this arrangement, light can be reflected upward. The term "inclination angle" used in the specification refers to an angle between the lower surface and one of the side surfaces of the demarcated portions of the semiconductor structure 20.

Forming Electrode

Next, a p-electrode 41 and an n-electrode 42 are formed on the upper side of the demarcated portions of the semiconductor structure 20. More specifically, a p-electrode 41 is formed on the upper surface of the p-type semiconductor 21, then from the upper surface side, a portion of each of the demarcated portions of the semiconductor structure 20 which includes the p-type semiconductor 21, the active layer 22, and a portion of the n-type semiconductor 23 are removed to expose a predetermined portion of the n-type semiconductor 23. Then, an n-type electrode 42 is formed on the exposed n-type semiconductor 23.

The p-electrode 41 can be made of a light-transmissive layer. For example, indium tin oxide, zinc oxide, indium oxide, tin oxide can be used, among those, indium tin oxide is preferably used. With the use of such a material, absorption of light by the electrode can be reduced and spread of the electric current can be facilitated.

An intermediate electrode 43 made of a metal can be disposed on a portion of the upper surface of the p-electrode 41. Direct connection of the p-electrode 41 and the p-pad electrode 81 may result in an increase of the electric resistance, but with the arrangement as described above, such an increase of the electric resistance can be avoided. For the intermediate electrode 43, Ti, Rh, Al, Cr, Ag, or the like, can be used.

The n-electrode 42 may employ the same material or a different material as the p-electrode 41. In the case of using a material which is different from the material of the p-electrode 41, a metal material such as Ti, Rh, Al, Cr, Ag, or the like can be used.

Forming Reflecting Layer 50

Figure 4:
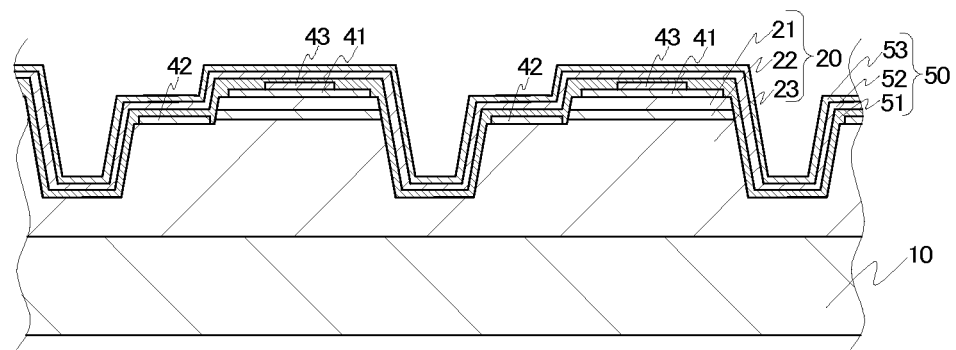
FIG. 4 is a schematic cross-sectional view illustrating a step of a method of producing a light emitting semiconductor element 1000 according to an embodiment.

Next, as shown in FIG. 4, a reflecting layer 50 is formed on the upper side of the wafer inclusive of the separation groove 30. That is, the reflecting layer 50 is formed on the surfaces defining the separation groove 30 and continuously onto the surfaces of the demarcated portions of the semiconductor structure 20 adjacent to the separation groove 30. In the present embodiment, the reflecting layer 50 includes an insulating layer 51, a dielectric multilayer film 52, and a metal layer 53, but it is sufficient that the reflecting layer 50 at least includes a dielectric multilayer film 52. With the reflecting layer 50, the optical output can be improved in the light emitting elements 1000 mounted in a face-down manner.

Next, an insulating layer 51 is formed on the upper side of the wafer inclusive of the portions defining the separation groove 30. With the insulating layer 51, incident light at a small angle to the normal to the surface can be totally reflected and then extracted. The insulating layer 51 is formed with a relatively large thickness and a material which has a refractive index smaller than that of a GaN-based semiconductor can be used. For the material of the insulating layer 51, silicon oxide, niobium oxide, etc., can be used. The insulating layer 51 may have a thickness of 200 nm to 800 nm, preferably 250 nm to 600 nm. With the thickness above a certain value, sufficient reflection can be achieved. With the thickness below a certain value, absorption of light by the insulating layer 51 can be reduced and effect of reflection by the dielectric multilayer film 52 can be maximally attained.

The insulating layer 51 is preferably formed by using sputtering, which requires a relatively short operation time. The insulating layer 51 can be formed by way of CVD, vapor deposition, ALD method, or the like, other than sputtering.

Next, by way of ALD method, a dielectric multilayer film 52 is formed on the upper side of the wafer inclusive of the portions defining the separation groove 30. The dielectric multilayer film 52 is formed on the entire of the upper side, that is, the upper side of the separation groove 30 and the demarcated portions of the semiconductor structure 20, of the wafer. In the present embodiment, the dielectric multilayer film 52 is formed on the upper side of the insulating layer 51. As the reflectance of the dielectric multilayer film 52 depends on the thickness of the dielectric layer, the uniformity in the thickness is important. With the use of ALD method, the dielectric multilayer film 52 can be formed with a relatively uniform thickness regardless of the direction of the surface where the dielectric multilayer film 52 is to be formed. Compare to that by using sputtering or vapor deposition, with the use of ALD method, the dielectric multilayer film 52 can be formed with uniform thickness and good quality even in the vicinity of obstacles such as the p-electrode 41 and the n-electrode 42.

The dielectric multilayer film 52 is a so-called DBR, in which, as shown in FIG. 13, a high refractive index material layer 52a and a low refractive index material layer 52b are used in combination. For example, two pair or more of titanium oxide/silicon oxide are stacked. For each layer that constitutes the dielectric multilayer film 52, for example, niobium oxide, aluminum oxide, zirconium oxide, aluminum nitride, silicon nitride, or the like can be used as well as titanium oxide and silicon oxide. With this arrangement, the incident light in a perpendicular direction can be reflected. The thickness of each layer that constitutes the dielectric multilayer film 52 may differ according to the emission wavelength and the material of each layer, and for example, a thickness of 40 nm to 200 nm, preferably 45 nm to 100 nm can be employed.

Next, a metal layer 53 is disposed on the upper side of the dielectric multilayer film 52. For the metal layer 53, for example, at least one metal selected from Al, Ag, Rh, and Ti can be included. With the metal layer 53 thus provided, light which cannot be reflected by neither the insulating layer 51 nor the dielectric multilayer film 52 becomes possible to be reflected and extracted, accordingly, light can be reflected and extracted without loss. At this time, a certain amount of light can be reflected by the dielectric multilayer film 52 disposed below the metal layer 53, so that absorption of light by the metal layer 53 can be reduced. The metal layer 53 may have a thickness of 60 nm to 300 nm, preferably 150 nm to 200 nm. Sufficient reflectance can be achieved with a thickness of greater than a certain amount, and mass productivity can be improved with a thickness of less than a certain amount.

Figure 5:
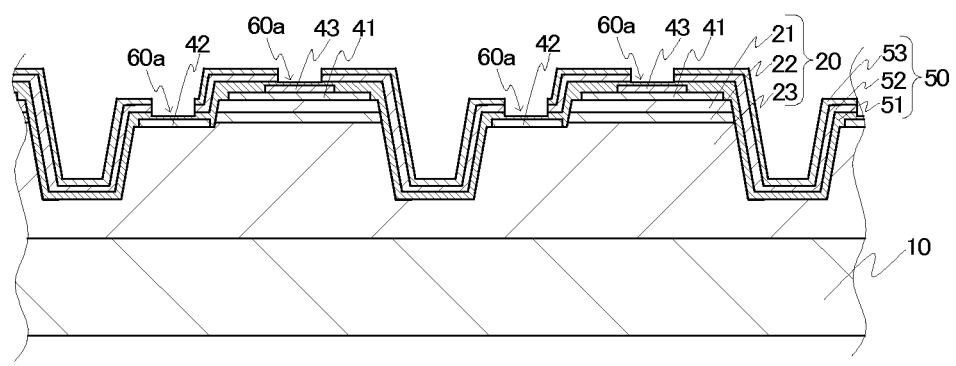
FIG. 5 is a schematic cross-sectional view illustrating a step of a method of producing a light emitting semiconductor element 1000 according to an embodiment.

Next, as shown in FIG. 5, in a top view of the wafer, the reflecting layer 50 formed on the p-electrode 41 and the n-electrode 42 are partially removed by way of etching or the like, to form a first opening 60a. The first opening 60a is preferably formed with a depth to a middle of thickness of the insulating layer 51 (that is, a depth so as not to reach either the p-electrode 41 nor the n-electrode 42). With this configuration, an excessive removal of the insulating layer 51 or the like in the vicinity of the p-electrode 41 and the n-electrode 42 can be avoided.

At this time, the first opening 60a is preferably defined with a planar dimension smaller than the planar dimension of the p-electrode 41. That is, in a top view of the wafer, the reflecting layer 50 is preferably removed so that the dielectric multilayer film 52 partially overlap the p-electrode 41. With this configuration, in the case of using a light-transmissive electrode as the p-electrode 41, light which passes through the p-electrode 41 can be reflected at the dielectric multilayer film 52 and extracted.

Figure 6:
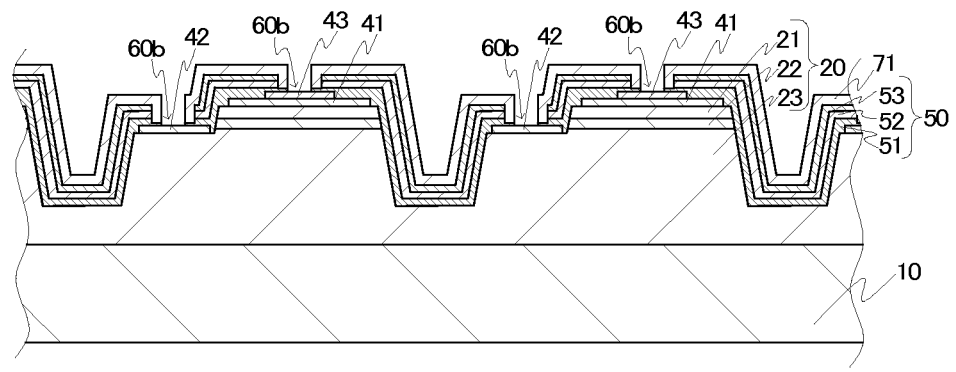
FIG. 6 is a schematic cross-sectional view illustrating a step of a method of producing a light emitting semiconductor element 1000 according to an embodiment.

Next, as shown in FIG. 6, the first protective layer 71 for protecting the demarcated portions of the semiconductor structure 20 is formed to cover the metal layer 53, and the reflecting layer 50 and the first protective layer 71 are partially removed to form a second opening 60b so as to expose respective portions of the p-electrodes 41 and the n-electrodes 42.

For the first protective layer 71, for example, silicon oxide can be used. With this arrangement, metal can be prevented from being exposed at the outermost surface of the light emitting elements 1000, so that the light emitting elements 1000 of high reliability which does not generates current leakage can be obtained. The first protective layer 71 may have a thickness of 50 nm to 800 nm, preferably 150 nm to 600 nm. With a thickness of greater than a certain value, the metal layer 53 can be securely protected, and with a thickness of smaller than a certain value, mass productivity can be improved.

The second opening 60b is defined by a periphery which is smaller than that of the first opening 60a. With this configuration, the metal layer 53 in the second opening 60b is covered with the first protective layer 71, so that each pad can be prevented from being in contact with the metal layer 53. Thus, occurrence of leakage can be prevented. The operation of forming the first opening 60a is not necessarily performed, and in the case of the reflecting layer 50 made solely of a dielectric multilayer film 52, only the second opening 60b is formed to expose the p-electrode 41 and the n-electrode 42.

Figure 7:
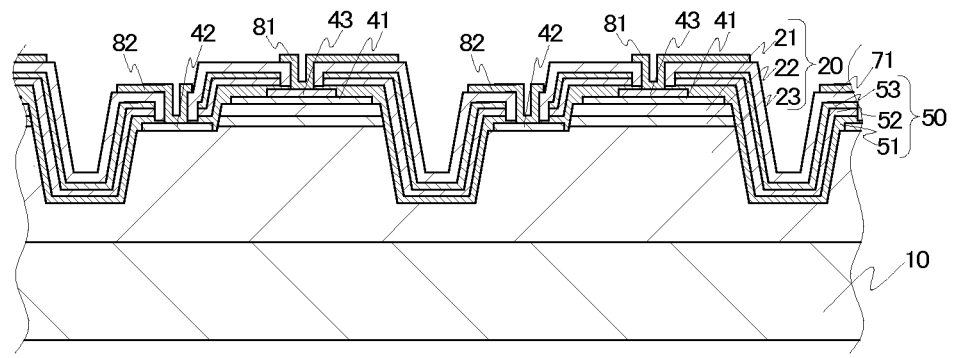
FIG. 7 is a schematic cross-sectional view illustrating a step of a method of producing a light emitting semiconductor element 1000 according to an embodiment.

Next, as shown in FIG. 7, a p-pad 81 and an n-pad 82 are disposed electrically connected to the p-electrode 41 and the n-electrode 42, respectively. The p-pad 81 and the n-pad 82 can be formed by plating or the like. Each of the pads is, for example, preferably made of a metal or an alloy which contains at least one element selected from the group consisting of zinc, nickel, platinum, palladium, rhodium, ruthenium, osmium, iridium, titanium, zirconium, hafnium, vanadium, niobium, tantalum, cobalt, iron, manganese, molybdenum, chromium, tungsten, lanthanum, copper, silver, gold, and yttrium. More specifically, titanium/rhodium/gold/titanium from the demarcated portions of the semiconductor structure 20 side can be employed.

Figure 8:
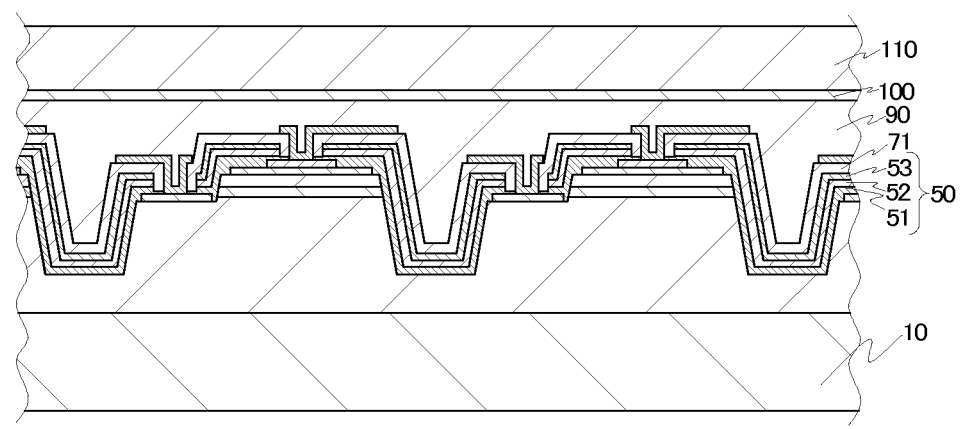
FIG. 8 is a schematic cross-sectional view illustrating a step of a method of producing a light emitting semiconductor element 1000 according to an embodiment.

Next, as shown in FIG. 8, the support substrate 110 is bonded to the upper side of the wafer. For the support substrate 110, a sapphire substrate or the like can be used.

The semiconductor structure 20 and the support substrate 110 are bonded with each other by an adhesive resin 90. Examples of the adhesive resin 90 include an epoxy resin, an acrylic resin, and a polyimide resin.

In the present embodiment, a photosensitive resin layer is formed as a releasing layer 100 on the surface (the surface to be bonded to the semiconductor structure 20) of the support substrate 110. That is, the releasing layer 100 is formed between the support substrate 110 and the adhesive resin 90. The releasing layer 100 is provided for separating the light emitting elements 1000 from the support substrate 110.

Figure 9:
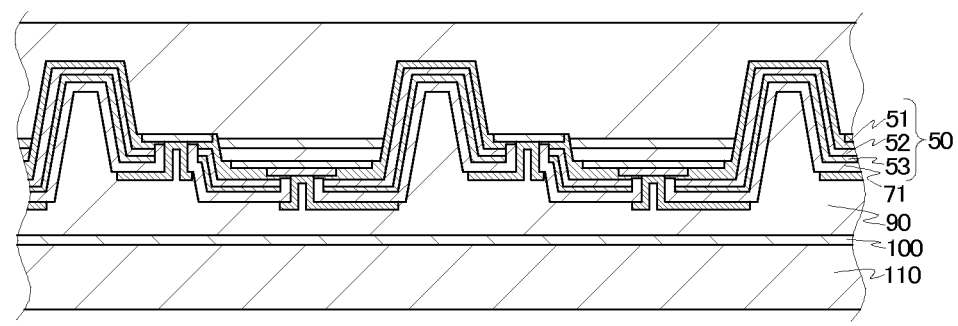
FIG. 9 is a schematic cross-sectional view illustrating a step of a method of producing a light emitting semiconductor element 1000 according to an embodiment.

Next, as shown in FIG. 9, using a laser lift off (LLO) method, the semiconductor structure 20 and the growth substrate 10 are separated. More specifically, two sets of laser beams with different energy levels are applied from below the lower side to thermally decompose the portion near the interface between the growth substrate 10 and the semiconductor structure 20. In the present embodiment, the separation groove 30 does not reach the growth substrate 10, so that even in the presence of some undecomposed regions due to insufficient laser irradiation at the time of LLO, there is a small possibility that one or more light emitting elements are removed with the growth substrate, so that the growth substrate 10 can be removed with good reproducibility. Also, with this arrangement, the laser beam is not necessarily irradiated on the entire interface between the growth substrate 10 and the semiconductor structure 20, so that mass productivity can be improved. In FIG. 1 to FIG. 8, the growth substrate 10 is shown at the lower side, but in FIG. 9 to FIG. 12, for the sake of convenience, the growth substrate 10 is shown at the upper side.

Separating Light Emitting Elements

Figure 10:
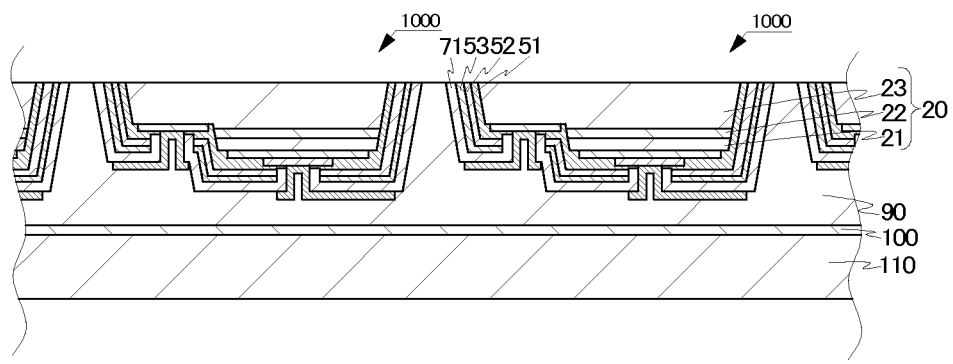
FIG. 10 is a schematic cross-sectional view illustrating a step of a method of producing a light emitting semiconductor element 1000 according to an embodiment.

Next, as shown in FIG. 10, a portion of the wafer is removed from the lower side of the wafer (upper side in FIG. 10) to the depth of the separation groove 30, so that a plurality of the light emitting elements 1000 are separated in the wafer. In the present embodiment, after the semiconductor structure 20 and the growth substrate 10 are separated, a portion of the semiconductor structure 20 is removed from the lower side of the semiconductor structure 20 to the depth of the separation groove 30. Examples of the methods to remove a portion of the semiconductor structure 20 include a mechanical polishing and a chemical mechanical polishing (CMP). Particularly, by way of CMP, higher flatness can be obtained and less likely to cause damages to the light emitting elements. In the case where the separation groove 30 is formed with a depth reaching the growth substrate 10, the light emitting elements 1000 can be obtained by removing a portion of the growth substrate 10 by using mechanical grinding, chemical mechanical grinding, or the like, without separating the semiconductor structure 20 and the growth substrate 10. Removing a portion of the wafer to reach the bottom edge defining the separation groove 30 allows for obtaining of the light emitting elements 1000 which have a dielectric multilayer film 52 formed on the entire region of the side surfaces of the light emitting elements 1000.

Figure 11:
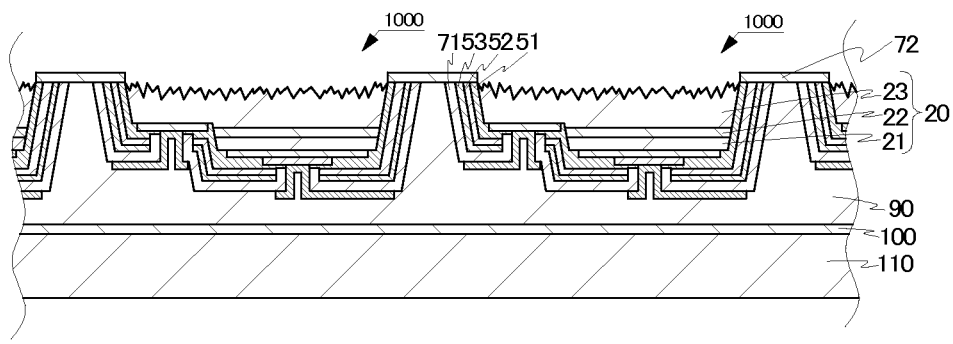
FIG. 11 is a schematic cross-sectional view illustrating a step of a method of producing a light emitting semiconductor element 1000 according to an embodiment.

Next, as shown in FIG. 11, to the exposed surfaces (of the n-type semiconductor 23) of the demarcated portions of the semiconductor structure 20, dry-etching with the use of ICP-RIE etc., or wet etching with the use of a strong alkaline aqueous solution is performed to roughen the surfaces of the demarcated portions of the n-type semiconductor 23. With the surface-roughening treatment, light extraction efficiency can be improved and the optical output can be increased. In the present embodiment, before the roughen treatment, a second protective layer 72 is disposed to a portion of the insulating layer 51, a dielectric multilayer film 52, and the metal layer 53 which are exposed at the upper side of the wafer. With this arrangement, at the time of roughen treatment, the dielectric multilayer film 52 and the metal layer 53 can be protected. Provided that the materials of the dielectric multilayer film 52 and the metal layer 53 is resistant to the etching solution, the roughen treatment can be performed without providing the second protective layer 72.

Figure 12:
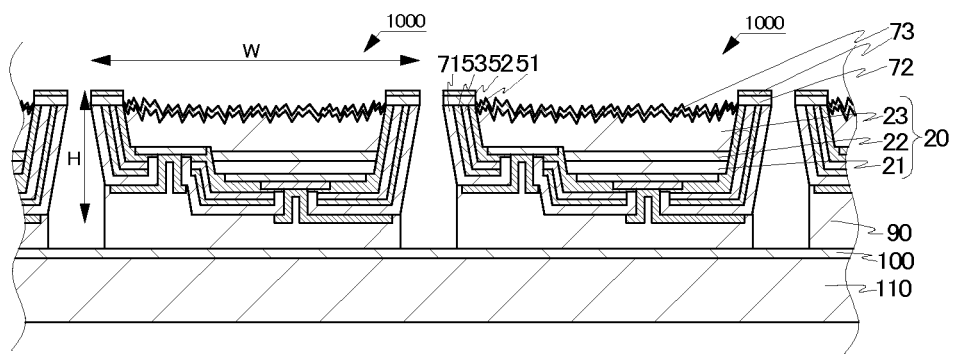
FIG. 12 is a schematic cross-sectional view illustrating a step of a method of producing a light emitting semiconductor element 1000 according to an embodiment.
Figure 13:
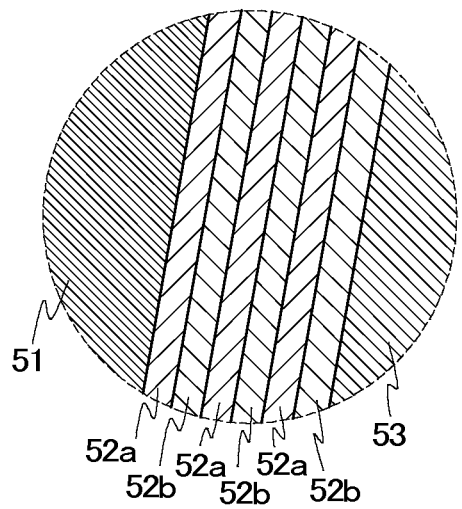
FIG. 13 is an enlarged view of a part enclosed by a broken line in FIG. 12.

Next, as shown in FIG. 12, the whole side where the growth substrate 10 was provided (that is, the opposite side from the support substrate 110) is protected with a third protective layer 73.

Then, the adhesive resin 90 that is filled in the separation groove 30 is removed by way of etching performed from the light emitting surface side to reach the releasing layer 100. With this arrangement, in the removing the support substrate 110, each of the light emitting elements can be separated from the support substrate 110 by simply removing the releasing layer 100.

Figure 14:
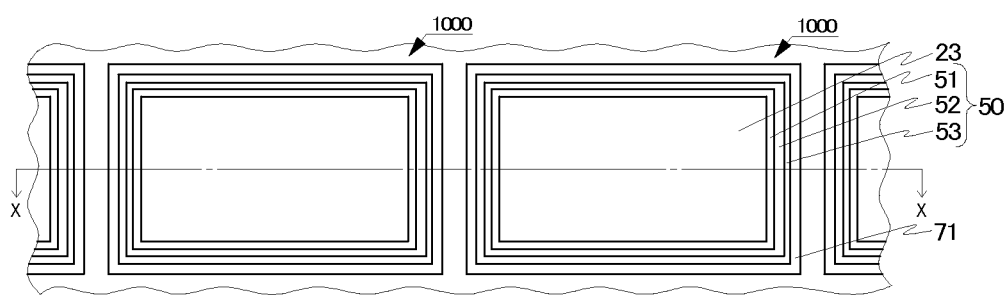
FIG. 14 is a diagram showing a state of the semiconductor light emitting element shown in FIG. 12 seen from above (light emitting surface side).

FIG. 14 shows the state illustrated in FIG. 12 which is viewed from the light emitting surface side. FIG. 12 is a cross-sectional view taken along line X-X of FIG. 14. FIG. 1 to FIG. 11 are cross-sectional views each showing the corresponding portion taken along line X-X. As shown in FIG. 14, each of the light emitting elements 1000 is provided with a reflecting layer 50 which surrounds the periphery of the demarcated portions of the semiconductor structure 20. With this arrangement, light can be reflected efficiently. In FIG. 14, for the sake of easy understanding, the first protective layer 71 and the second protective layer 72 are not shown.

Figure 15:
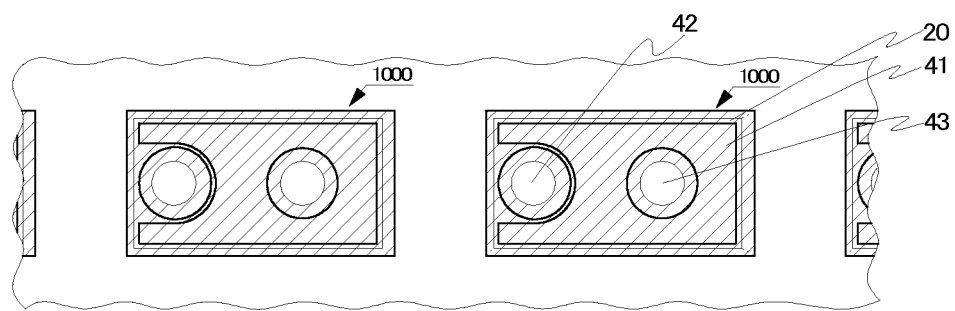
FIG. 15 is a diagram showing a state of the semiconductor light emitting element shown in FIG. 12 seen from below (mounting surface side).

Further, the state illustrated in FIG. 12 which is viewed from the mounting surface side is shown in FIG. 15. As shown in FIG. 15, each of the light emitting elements 1000 is provided with a reflecting layer 50 not only on the side surfaces of the demarcated portions of the semiconductor structure 20 but also on the upper surface except for a portion of the n-electrode 42 and a portion of the intermediate electrode 43. With this arrangement, light can be reflected efficiently. In FIG. 15, for the sake of easy understanding, the reflecting layer 50 is not shown in the figure but a region for disposing the reflecting layer 50 is shown by hatching.

Next, the light emitting elements 1000 are separated from the support substrate 110. More specifically, after separating the light emitting elements, the support substrate 110 can be removed from each of the light emitting elements by irradiating light on the optically sensitive resin. After the support substrate 110 is removed, the adhesive resin 90 remaining on the light emitting elements 1000 is removed by etching. Accordingly, the light emitting elements 1000 which do not have the growth substrate and the support substrate 110 can be obtained. Provided that it is possible to obtain the light emitting elements 1000 which have respective support substrate 110. The light emitting elements 1000 illustrated in the present specification are light emitting diodes (LEDs).

The light emitting elements 1000 can be made with a maximum length H (length in up/down direction in FIG. 12) in the longitudinal direction which is 0.1 to 0.5 times, more preferably 0.2 to 0.4 times with respect to the maximum length W in the lateral direction. That is, compared to the conventional light emitting elements, the ratio of the maximum longitudinal length H with respect to the maximum lateral length W can be increased. With this arrangement, effect of the light-reflecting on the side surfaces increases, so that the effect of improvement in the light extracting can be more significant.

EXAMPLE 1

Example 1 corresponds to the light emitting elements 1000 as shown in FIG. 1 to FIG. 13. In the below, the light emitting elements according to Example 1 will be described with reference to FIG. 1 to FIG. 13.

A wafer was provided with a semiconductor structure 20 of an n-type semiconductor 23, an active layer 22, and a p-type semiconductor 21 respectively made of an nitride-based semiconductor stacked in this order on a growth substrate 10 made of sapphire (see FIG. 1). Then, a separation groove 30 of a predetermined depth that does not reach the growth substrate 10 was formed from an upper side of the wafer (see FIG. 2). At this time, the separation groove 30 was formed with a shape gradually narrowed from the upper side toward the lower side (an inclination angle between the bottom of the separation groove 30 and a side of the semiconductor structure 20 was approximately 105°). Further, a portion of the semiconductor structure 20 was removed from the upper side of the wafer so that the n-type semiconductor 23 is exposed (see FIG. 3).

Figure 3:
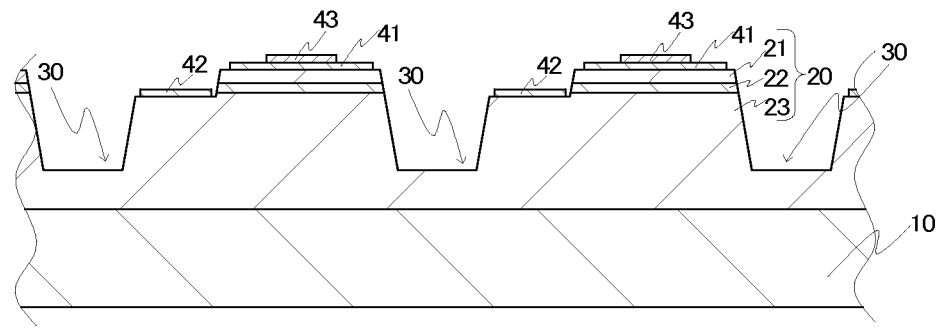
FIG. 3 is a schematic cross-sectional view illustrating a step of a method of producing a light emitting semiconductor element 1000 according to an embodiment.

Next, a p-electrode 41 of indium tin oxide was disposed on the p-type semiconductor 21 and then an intermediate electrode 43 of titanium/rhodium was disposed on a portion of the p-electrode 41 (see FIG. 3). Further, an n-electrode 42 made of titanium/rhodium was formed on an upper side of the n-type semiconductor 23 (see FIG. 3).

Then, a reflecting layer 50 to reflect light from the active layer was formed on the upper side of the wafer inclusive of the separation groove 30 (see FIG. 4). More specifically, an insulating layer 51 (design thickness of 300 nm) made of silicon oxide was formed by using ALD method. Next, three pairs of alternating titanium oxide layers (design thickness of 49.5 nm) and silicon oxide layers (design thickness of 86.2 nm) were formed on the insulating layer 51. Further, a metal layer 53 (design thickness of 300 nm) made of titanium was formed on the dielectric multilayer film 52 by using sputtering method.

Now, the term "design thickness" used in the present specification will be described with taking an example of silicon oxide. In the case of using an ALD method, first, silicon oxide is formed on a base member which has one plane by performing the reaction for a predetermined number of times. Next, based on the relationship between the number of times of reaction that have been performed and the thickness of silicon oxide that have been obtained, the number of times of reaction to obtain a desired thickness of silicon oxide is determined Accordingly, in the case of performing the reaction for the number of times, silicon oxide of a thickness which corresponds to the number of times of reaction is assumed to be obtained. That is, in the case of using an ALD method, the thickness assumed to be obtained based on the number of times of reaction is referred to as a "design thickness". Meanwhile, in the case of using a sputtering method, first, silicon oxide is formed on a base member which has one plane by performing a reaction for a predetermined time. Next, based on the relationship between the reaction time that have been performed and the thickness of silicon oxide that have been obtained, the reaction time to obtain a desired thickness of silicon oxide is determined Accordingly, in the case of performing the reaction for a predetermined time, silicon oxide of a thickness which corresponds to the reaction time is assumed to be obtained. That is, in the case of using a sputtering method, the thickness assumed to be obtained based on the reaction time is referred to as a "design thickness". In the case of using either an ALD method or a sputtering method, the design thickness referred in the present specification is assumed the thickness of silicon oxide formed on one plane and is not assumed the thickness of silicon oxide simultaneously formed on planes with different inclination angles.

Next, the reflecting layer 50 formed at an upper side of the p-electrode 41 and the n-electrode 42 was partially removed by etching to form a first opening 60a (see FIG. 5). Next, a first protective layer 71 made of silicon oxide was formed by using a CVD method to cover the metal layer 53. Then, the reflecting layer 50 and the first protective layer 71 were partially removed to expose the p-electrode 41 and the n-electrode 42 respectively, to form a second opening 60b defined by an outer periphery that was smaller than that of the first opening 60a (see FIG. 6). Next, a p-pad 81 made of titanium/rhodium/gold/titanium was formed at an upper side of the p-electrode 41 and an n-pad 82 made of titanium/rhodium/gold/titanium was formed at an upper side of the n-electrode 42 (see FIG. 7). Then, a light-sensitive resin that serves as a releasing layer 100 and an epoxy resin that serves as an adhesive resin 90 were formed in the order on the support substrate 110 made of sapphire, and the upper side of the wafer and the support substrate 110 were adhered with each other so that the semiconductor structure 20 is embedded in the epoxy resin (see FIG. 8).

Next, by using an LLO method, the semiconductor structure 20 and the growth substrate 10 are separated (see FIG. 9). Then, by way of CMP, a portion of the semiconductor structure 20 was removed from the lower side of the semiconductor structure 20 to the depth of the separation groove 30.

Next, the n-type semiconductor 23 exposed at a lower side of the semiconductor structure 20 was processed with surface-roughening by way of wet etching (see FIG. 11). Next, a third protective layer 73 was formed on the entire side (the n-type semiconductor 23 subjected to roughening, the reflecting layer 50 exposed at a lower side of the semiconductor structure 20, and the first protective layer 71) where the growth substrate 10 had been formed. Then, the adhesive resin 90 that is filled in the separation groove 30 was removed by way of etching performed from the light emitting surface side to reach the releasing layer 100 (see FIG. 12). Then, light was irradiated on the releasing layer 100 to remove the support substrate 110 from each of the light emitting elements (see FIG. 12). As described above, light emitting elements with a peak wavelength of 459 nm were fabricated.

EXAMPLE 2

In Example 2, the semiconductor structure 20 was constituted to have a peak wavelength of 522 nm. Three pairs of alternating titanium oxide layers with a design thickness of 58.5 nm and silicon oxide layers with a design thickness of 98.2 nm were formed to constitute the dielectric multilayer film. The thickness of each layer of the dielectric multilayer film 52 was determined in view of the peak wavelength of the light emitting element. Other configurations in the present example were substantially similar to those in Example 1.

Comparative Example 1

Comparative example 1 was conducted in a substantially similar as in Example 1, except that the dielectric multilayer film of Example 1 was formed by using a sputtering method.

Comparative Example 2

Comparative Example 2 was conducted in a substantially similar as in Example 2, except that the dielectric multilayer film of Example 2 was formed by using a sputtering method.

Evaluation

A light emitting element obtained in Example 1 exhibited approximately 50% higher luminance than that obtained in Comparative Example 1, and the light emitting element obtained in Example 2 exhibited approximately 30% higher luminance than that obtained in Comparative Example 2. The rate of increase in luminance exhibited in Example 1 compares to that in Comparative Example 1 and the rate of increase in luminance exhibited in Example 2 compares to that in Comparative Example 2 were different, but both examples exhibited significant increase in the luminance compared to that in respective comparative examples. This is considered that in each comparative example, a sputtering method was used to form the dielectric multilayer film, which resulted in different thickness of the dielectric multilayer film on an upper side and a side of the light emitting elements, whereas in each example, an ALD method was used to form the dielectric multilayer film, so that the dielectric multilayer film of approximately uniform thickness on both the upper side and sides of the light emitting elements (that is, the entire upper side of the wafer) can be formed.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:
1. A method of producing light emitting elements comprising:
    providing a wafer that includes a growth substrate and a semiconductor structure formed on the growth substrate, a lower side of the wafer being a growth substrate side, and an upper side of the wafer being a semiconductor structure side as an upper side;
    forming a separation groove in the wafer from the upper side of the wafer to demarcate portions of the semiconductor structure, the separation groove extending in a depth direction to a location in the wafer;
    forming a p-electrode and an n-electrode on an upper side of each of the demarcated portions of the semiconductor structure;
    forming a dielectric multilayer film at an upper side of the wafer, including portions defining the separation groove, by using an atomic layer deposition method; and
    separating the wafer into a plurality of light emitting elements by removing a portion of the wafer from a lower side of the wafer to at least said location to which the separation groove extends.
2. The method of producing light emitting elements according to claim 1, further comprising, after forming the p-electrode and the n-electrode and before forming the dielectric multilayer film, forming an insulating layer at an upper side of the wafer, including the portions defining the separation groove.
3. The method of producing light emitting elements according to claim 1 further comprising, after the step of forming the dielectric multilayer film and before the step of removing said portion of the wafer, forming a metal layer at an upper side of the dielectric multilayer film.
4. The method of producing light emitting elements according to claim 1, wherein:
    in the step of providing the wafer, the wafer is provided so as to include the growth substrate and the semiconductor structure having an n-type semiconductor and a p-type semiconductor in that order from the growth substrate side,
    in the step of forming the p-electrode and the n-electrode, a light-transmissive layer is formed as the p-electrode, and
    in the step of forming the dielectric multilayer film, the dielectric multilayer film is formed at an upper side of the p-electrode.

5. The method of producing light emitting elements according to claim 1, wherein:
in the step of forming the dielectric multilayer film, the dielectric multilayer film is formed at an upper side of the p-electrode, and the method further comprises:
after the step of forming the dielectric multilayer film and before the step of removing said portion of the wafer, partially removing the dielectric multilayer film disposed at the upper side of the p-electrode; and
forming a p-pad and an n-pad respectively electrically connected to the p-electrode and the n-electrode.

6. The method of producing light emitting elements according to claim 1, wherein, in the step of forming a separation groove, the separation groove is formed from the upper side of the wafer so as not to reach the growth substrate.

7. The method of producing light emitting elements according to claim 2, further comprising, after the step of forming the dielectric multilayer film and before the step of removing said portion of the wafer, forming a metal layer at an upper side of the dielectric multilayer film.

8. The method of producing light emitting elements according to claim 7, wherein, in the step of forming the separation groove, the separation groove is formed from the upper side of the wafer so as not to reach the growth substrate.

9. The method of producing light emitting elements according to claim 1, wherein, in the step of forming the separation groove, the separation groove is formed so as to gradually widen from the upper side of the wafer toward the lower side of the wafer.

10. The method of producing light emitting elements according to claim 8, wherein, in the step of forming the separation groove, the separation groove is formed so as to gradually widen from the upper side of the wafer toward the lower side of the wafer.

11. The method of producing light emitting elements according to claim 1, further comprising, after the step of forming the dielectric multilayer film and before the step of removing said portion of the wafer, attaching a support substrate to the upper side of the wafer by using an adhesive resin.

12. The method of producing light emitting elements according to claim 10, further comprising, after the step of forming the dielectric multilayer film and before the step of removing said portion of the wafer, attaching a support substrate to the upper side of the wafer by using an adhesive resin.

13. The method of producing light emitting elements according to claim 6, wherein, in the step of removing said portion of the wafer, the semiconductor structure and the growth substrate are separated and a portion of the semiconductor structure is removed from a lower side of the semiconductor structure to at least said location to which the separation groove extends.

14. The method of producing light emitting elements according to claim 8, wherein, in the step of removing said portion of the wafer, the semiconductor structure and the growth substrate are separated and a portion of the semiconductor structure is removed from a lower side of the semiconductor structure to at least said location to which the separation groove extends.

15. The method of producing light emitting elements according to claim 12, wherein, in the step of removing said portion of the wafer, the semiconductor structure and the growth substrate are separated and a portion of the semiconductor structure is removed from a lower side of the semiconductor structure to at least said location to which the separation groove extends.

16. The method of producing light emitting elements according to claim 1, wherein the dielectric multilayer film contains titanium oxide and silicon oxide.

17. The method of producing light emitting elements according to claim 1, wherein the light emitting element has a maximum length in a longitudinal direction that is 0.1 times to 0.5 times a maximum length in a lateral direction.

18. The method of producing light emitting elements according to claim 12, wherein the light emitting element has a maximum length in a longitudinal direction that is 0.1 times to 0.5 times a maximum length in a lateral direction.

19. The method of producing light emitting elements according to claim 18, wherein, in the step of forming the separation groove, the separation groove is formed with a depth of 3 $\mu$m to 7 $\mu$m.

* * * * *